(12) United States Patent
Choi et al.

(10) Patent No.: US 11,586,258 B2
(45) Date of Patent: Feb. 21, 2023

(54) BONDING STRUCTURE AND DISPLAY DEVICE INCLUDING THE SAME

(71) Applicant: SAMSUNG DISPLAY CO., LTD., Yongin-si (KR)

(72) Inventors: Hayoung Choi, Cheonan-si (KR); Chung-Seok Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/939,866

(22) Filed: Jul. 27, 2020

(65) Prior Publication Data
US 2021/0157374 A1    May 27, 2021

(30) Foreign Application Priority Data
Nov. 21, 2019  (KR) .................. 10-2019-0150591

(51) Int. Cl.
*G06F 1/18* (2006.01)
(52) U.S. Cl.
CPC .............. *G06F 1/189* (2013.01); *G06F 1/183* (2013.01)
(58) Field of Classification Search
CPC ....................................................... H05K 5/02
See application file for complete search history.

(56) References Cited

U.S. PATENT DOCUMENTS

| 9,768,106 B2 | 9/2017 | Cho et al. |
| 2011/0235286 A1 | 9/2011 | Kitayama et al. |
| 2015/0043187 A1* | 2/2015 | Lee .................. H05K 1/028 361/784 |
| 2017/0118838 A1* | 4/2017 | Williams ............ H05K 3/061 |

FOREIGN PATENT DOCUMENTS

| KR | 10-2012-0139305 | 12/2012 |
| KR | 10-2019-0023028 | 3/2019 |
| KR | 10-2019-0074330 | 6/2019 |
| KR | 10-2019-0079086 | 7/2019 |

* cited by examiner

*Primary Examiner* — Jerry Wu
(74) *Attorney, Agent, or Firm* — F. Chau & Associates, LLC (57) ABSTRACT

A display device includes a display panel, a bonding substrate and a bridge board. The display panel includes a pixel array disposed on a base substrate and an input pad electrically connected to the pixel array. The bonding substrate is disposed under the display panel and includes an output pad. The bridge board is bonded to the input pad of the display panel and the output pad of the bonding substrate to electrically connect the display panel to the bonding substrate, wherein the bridge board includes a rigid material.

18 Claims, 10 Drawing Sheets

BONDING STRUCTURE AND DISPLAY DEVICE INCLUDING THE SAME

CROSS-REFERENCE TO RELATED APPLICATION

This application claims priority under 35 U.S.C. § 119 to Korean Patent Application No. 10-2019-0150591 filed on Nov. 21, 2019, the disclosure of which is incorporated by reference herein in its entirety.

TECHNICAL FIELD

Exemplary embodiments of the present inventive concept relate to a display device, and more particularly, to a display device including a bonding structure.

DISCUSSION OF THE RELATED ART

A display device includes a display panel and a driver which provides a driving signal to the display panel. The driver may be included in a driving chip. The driving chip may be combined directly with a substrate of the display panel, or may be connected to a pad part through a flexible printed circuit board or the like.

The flexible printed circuit board, on which the driving chip is mounted, needs to be bent to connect to a printed circuit board disposed on a lower surface of the display panel. A space is needed for bending of the flexible printed circuit board and the space may increase a bezel or a thickness of the display device. When a curvature is reduced in order to reduce the space for bending of the flexible printed circuit board, a bending stress may increase causing a bonding failure due to the bending stress.

SUMMARY

Exemplary embodiments of the inventive concept provide a display device having a reduced bezel or thickness and improved reliability.

According to an exemplary embodiment of the inventive concept, a display device includes a display panel, a bonding substrate and a bridge board. The display panel includes a pixel array disposed on a base substrate and an input pad electrically connected to the pixel array. The bonding substrate is disposed under the display panel and includes an output pad. The bridge board is bonded to the input pad of the display panel and the output pad of the bonding substrate to electrically connect the display panel to the bonding substrate. The bridge board includes a rigid material.

In an exemplary embodiment, the bridge board includes a cured resin.

In an exemplary embodiment, the bridge board has a step shape or an L-shape.

In an exemplary embodiment, the bridge board includes a first body portion and a second body portion. The first body portion extends along a horizontal direction and has a lower surface facing an upper surface of the input pad. The second body portion extends from the first body portion along a vertical direction and has a side surface facing a side surface of the base substrate.

In an exemplary embodiment, the bridge board further includes a first connection pad and a second connection pad. The first connection pad is disposed on a lower surface of the first body portion and bonded to the input pad. The second connection pad is disposed on a lower surface of the second body portion and bonded to the output pad.

In an exemplary embodiment, a pitch between two adjacent second connection pads is larger than a pitch between two adjacent first connection pads.

In an exemplary embodiment, the bridge board further includes a via connection portion that electrically connects the first connection pad to the second connection pad and passes through the second body portion.

In an exemplary embodiment, the bridge board further includes a side connection portion that electrically connects the first connection pad to the second connection pad and extends along the side surface of the second body portion.

In an exemplary embodiment, the bridge board further includes a third body portion protruding from the second body portion and extending along a horizontal direction, and having an upper surface facing a lower surface of the base substrate.

In an exemplary embodiment, the bridge board further includes a first connection pad and a second connection pad. The first connection pad is disposed on a lower surface of the first body portion and bonded to the input pad. The second connection pad is disposed on a lower surface of the third body portion and bonded to the output pad.

In an exemplary embodiment, a length of the first connection pad is larger than a length of the second connection pad.

In an exemplary embodiment, the bridge board further includes a first connection pad, a second connection pad, and a via connection portion that electrically connects the first connection pad to the second connection pad and passes through the second body portion and the third body portion.

In an exemplary embodiment, the bridge board further includes a first connection pad, a second connection pad, and a side connection portion that electrically connects the first connection pad to the second connection pad and extends along the side surface of the second body portion, the upper surface of the third body portion and a side surface of the third body portion.

In an exemplary embodiment, the bonding substrate includes a flexible printed circuit board including a polymeric base film.

In an exemplary embodiment, the bonding substrate includes a driving chip mounted thereon.

In an exemplary embodiment, a display device further includes a control substrate electrically connected to the bonding substrate.

According to an exemplary embodiment of the inventive concept, a display device includes a display panel, a bonding substrate and a bridge board. The display panel includes a pixel array disposed on a base substrate and an input pad electrically connected to the pixel array. The bonding substrate is disposed under the display panel and includes an output pad. The bridge board is bonded to the input pad of the display panel and the output pad of the bonding substrate to electrically connect the display panel to the bonding substrate. The bridge board includes a first body portion and a second body portion. The first body portion faces the input pad and extends along a horizontal direction. The second body portion extends from the first body portion along a vertical direction and has a side surface facing a side surface of the base substrate. A vertical thickness of the first body portion is smaller than a horizontal width of the second body portion.

According to exemplary embodiments of the inventive concept, a display panel is connected to a bonding substrate disposed thereunder through a bridge board without using a flexible printed circuit board.

Thus, an increase of bezel or a thickness due to a space required for the bending of a flexible printed circuit board can be prevented, and a bending failure due to a bending stress can be prevented.

Furthermore, distribution defects caused by elongation of a flexible printed circuit board when the flexible printed circuit board is bonded directly to the display panel can be prevented.

BRIEF DESCRIPTION OF THE DRAWINGS

The above and other features of the inventive concept will become more apparent by describing in detail exemplary embodiments thereof with reference to the accompanying drawings, in which.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Exemplary embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise.

Exemplary embodiments of the inventive concept are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing, as would be understood by a person having ordinary skill in the art.

Figure 1:
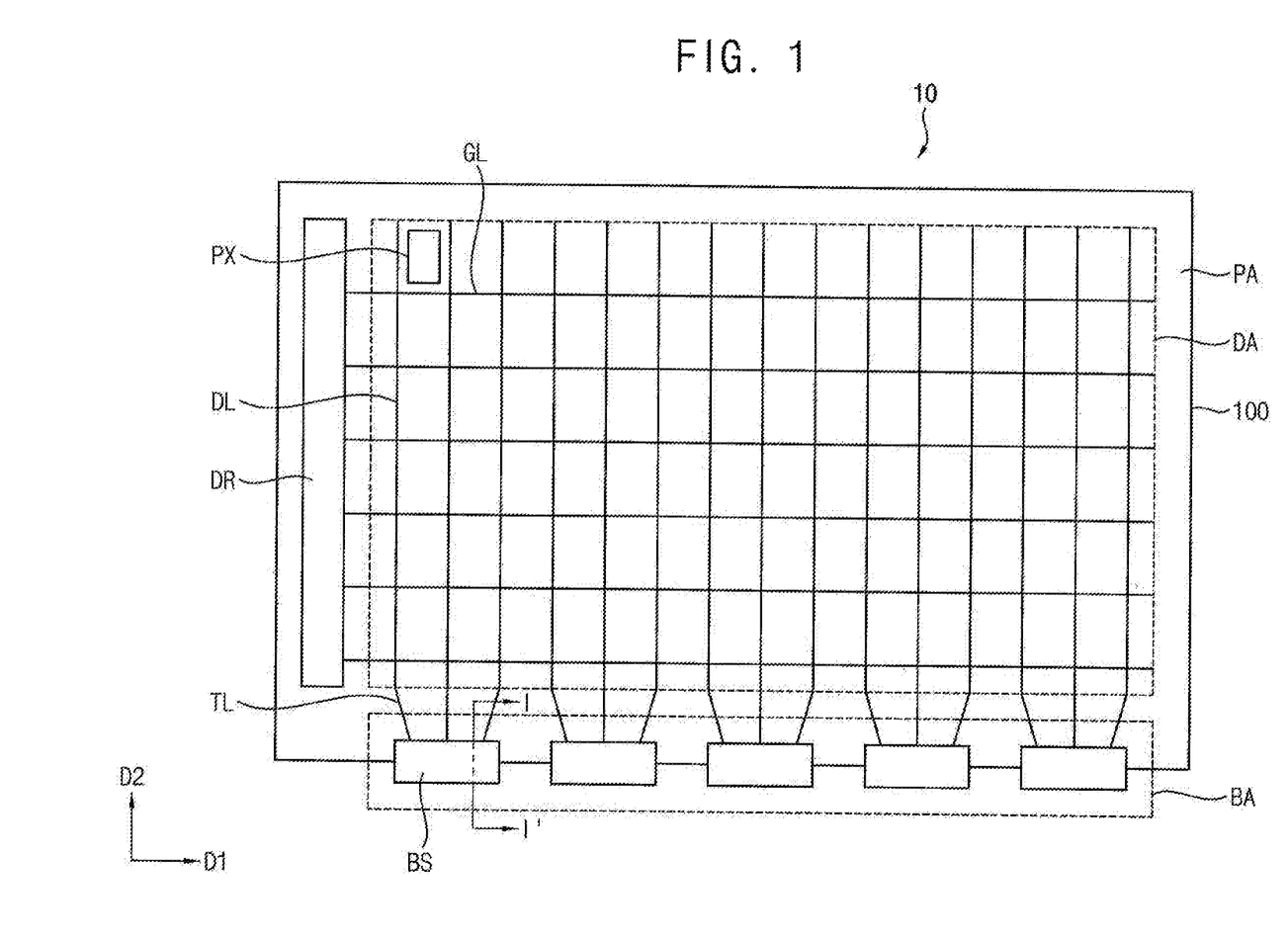
FIG. 1 is a plan view of a display device according to an exemplary embodiment of the inventive concept.
Figure 2:
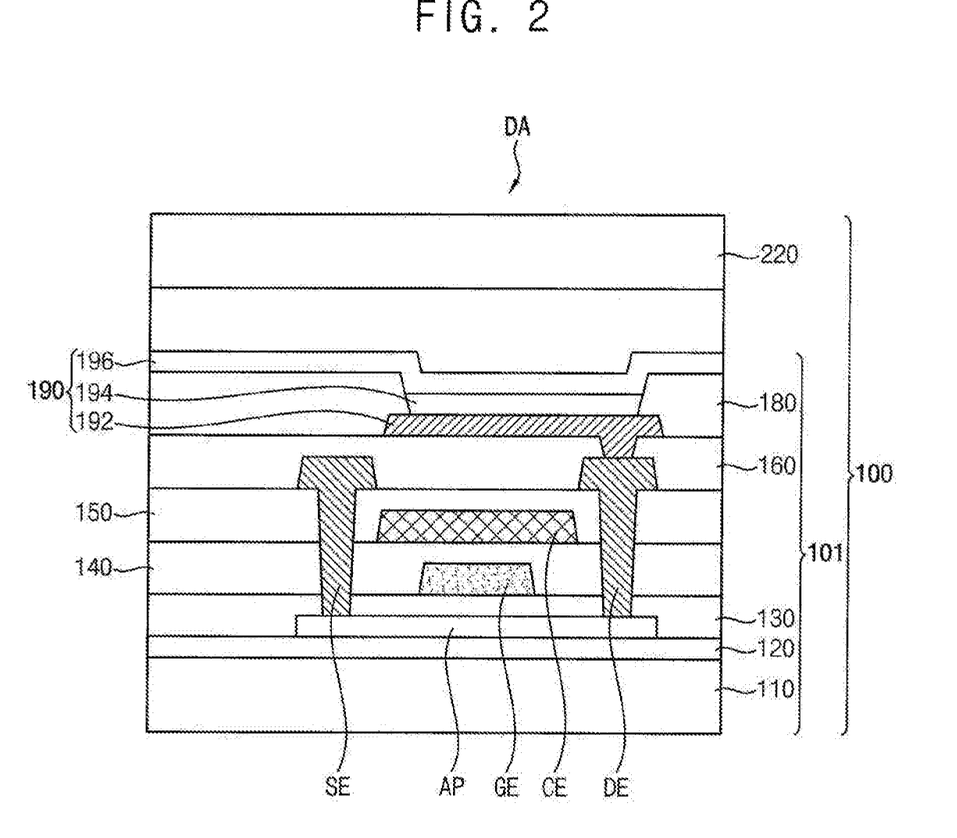
FIG. 2 is a cross-sectional view illustrating a display area of a display device according to an exemplary embodiment of the inventive concept.
Figure 3:
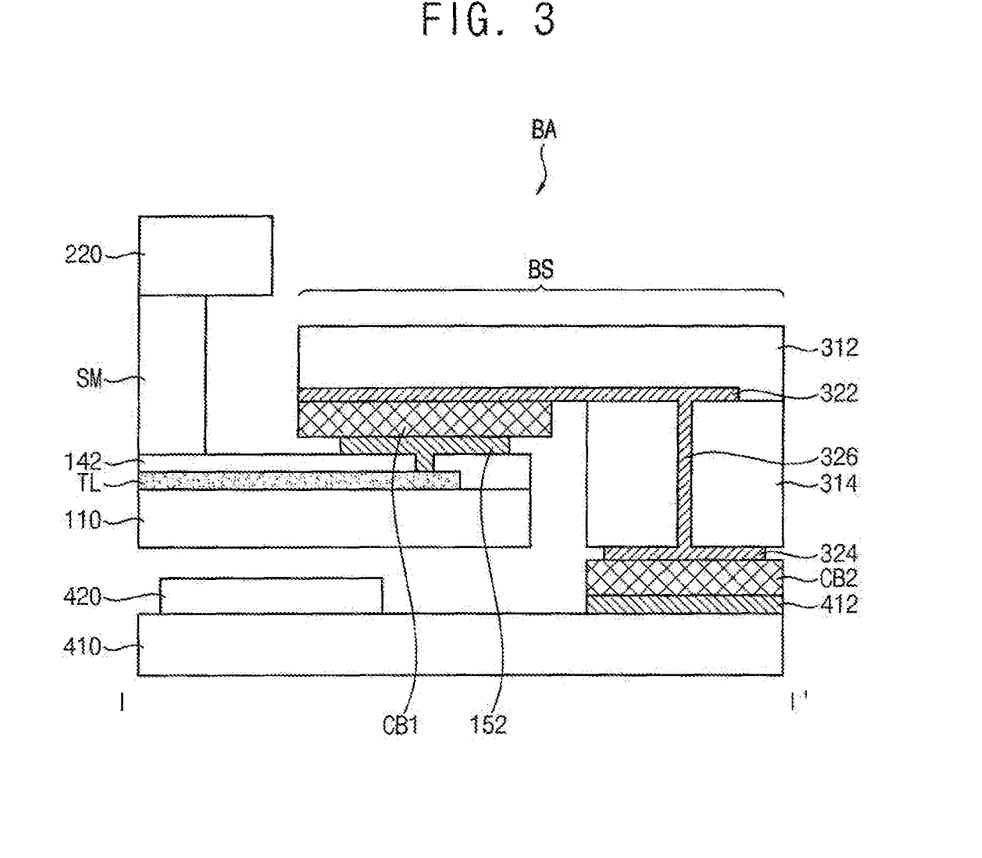
FIG. 3 is a cross-sectional view taken along line I-I' of FIG. 1 illustrating a bonding area of a display device according to an exemplary embodiment of the inventive concept.

FIG. 1 is a plan view of a display device according to an exemplary embodiment of the inventive concept. FIG. 2 is a cross-sectional view illustrating a display area of a display device according to an exemplary embodiment. FIG. 3 is a cross-sectional view taken along line I-I' of FIG. 1 illustrating a bonding area of a display device according to an exemplary embodiment.

Referring to FIGS. 1 and 2, a display device 10 according to an exemplary embodiment may include a display panel 100 and a bridge board BS.

The display panel 100 may include a display area DA and a peripheral area PA surrounding or adjacent to the display area DA. The display area DA may generate a light or may adjust transmittance of a light provided by an external light source and display an image. The peripheral area PA may be defined as an area where the peripheral area PA does not display an image. In one exemplary embodiment of the inventive concept, the peripheral area PA may be arranged around a plurality of sides of the display area DA.

In an exemplary embodiment of the inventive concept, the display panel 100 may be an organic light-emitting display panel. For example, an array of pixels PX including a light-emitting element may be disposed in the display area DA to generate a light in response to a driving signal. A signal wiring and a power wiring may be disposed in the display area DA to transmit a driving signal and a power signal to the pixels PX. For example, a gate line GL, and a data line DL may be disposed in the display area DA. The gate line GL may extend along a first direction D1 and may provide a gate signal to the pixels PX. The data line DL may extend along a second direction D2 crossing the first direction D1 and may provide a data signal to the pixels PX. A power line may be further disposed in the display area DA to provide a power signal to the pixels PX.

A transfer wiring TL, a circuit part or the like may be disposed in the peripheral area PA. The transfer wiring may transmit a driving signal or a power signal to the display area DA. The circuit part may generate a driving signal. For example, a driver DR that generates a gate signal and a transfer wiring TL and transmits a driving signal to the display area DA may be disposed in the peripheral area PA. For example, the transfer wiring TL may be a fan-out wiring transmitting a data signal to the data line DL. In one exemplary embodiment, a control signal wiring transmitting a control signal to the driver DR may be disposed in the peripheral area PA. A power bus wiring that provides power to the pixels PX or the like may be disposed in the peripheral area PA.

In an exemplary embodiment of the inventive concept, the peripheral area PA may include a bonding area BA where the bridge board BS is bonded to the bonding area BA.

The transfer wiring TL may extend to a side end of the peripheral area PA. The transfer wiring TL may be electrically connected to an input pad. The input pad may be electrically connected to the bridge board BS. The bridge board BS may be electrically connected to a driving device. Thus, the transfer wiring TL may be electrically connected to the driving device to receive a driving signal, a control signal, a power signal or the like.

In an exemplary embodiment of the inventive concept, a plurality of input pads may be arranged along the first direction D1 in the bonding area BA.

Referring to FIG. 2, a pixel unit disposed in the display area DA may include a driving element disposed on a base substrate 110 and a light-emitting element electrically connected to the driving element. In an exemplary embodiment of the inventive concept, the light-emitting element may include an organic light-emitting diode, but not limited to an organic light-emitting diode. The driving element may include at least one thin film transistor.

A buffer layer 120 may be disposed on the base substrate 110. An active pattern AP may be disposed on the buffer layer 120.

For example, the base substrate 110 may include glass, quartz, sapphire, a polymeric material or the like. In an exemplary embodiment, the base substrate 110 may include a transparent rigid material such as glass.

The buffer layer 120 may prevent or reduce permeation of impurities, humidity or external gas permeating from the underneath of the base substrate 110, and may planarize an upper surface of the base substrate 110. For example, the buffer layer 120 may include an inorganic material such as oxide, nitride or the like.

A first gate metal pattern including a gate electrode GE may be disposed on the active pattern AP. A first insulation layer 130 may be disposed between the active pattern AP and the gate electrode GE.

A second gate metal pattern including a capacitor electrode pattern CE may be disposed on the gate electrode GE. The capacitor electrode pattern CE may include a capacitor electrode for forming a capacitor, and a wiring for transmitting various signals or the like.

A second insulation layer 140 may be disposed between the gate electrode GE and the capacitor electrode pattern CE. A third insulation layer 150 may be disposed on the capacitor electrode pattern CE.

For example, the active pattern AP may include silicon or a metal oxide semiconductor. In an exemplary embodiment of the inventive concept, the active pattern AP may include polycrystalline silicon (polysilicon), which may be doped with n-type impurities or p-type impurities.

In one exemplary embodiment of the inventive concept which is not illustrated in FIG. 2, an active pattern AP may include a metal oxide semiconductor. For example, the active pattern AP may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The first insulation layer 130, the second insulation layer 140 and the third insulation layer 150 may include silicon oxide, silicon nitride, silicon carbide or a combination thereof. Furthermore, the first insulation layer 130, the second insulation layer 140 and the third insulation layer 150 may include an insulating metal oxide such as aluminum oxide, tantalum oxide, hafnium oxide, zirconium oxide, titanium oxide or the like. For example, the first insulation layer 130, the second insulation layer 140 and the third insulation layer 150 may have a single-layered structure or a multi-layered structure including either silicon nitride or silicon oxide or both materials, respectively, or may have different structures from one another.

The gate electrode GE and the capacitor electrode pattern CE may include a metal, a metal alloy, a metal nitride, a conductive metal oxide or the like. For example, the gate electrode GE and the capacitor electrode pattern CE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure comprising different metal layers.

A first source metal pattern may be disposed on the third insulation layer 150. The first source metal pattern may include a source electrode SE and a drain electrode DE, which electrically make contact with the active pattern AP. The source electrode SE and the drain electrode DE may pass through the insulation layers disposed thereunder to make contact with the active pattern AP, respectively.

The first source metal pattern may include a metal, a metal alloy, a metal nitride, a conductive metal oxide or the like. For example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an exemplary embodiment of the inventive concept, the first source metal pattern may have a multi-layered structure including an aluminum layer.

A fourth insulation layer 160 may be disposed on the first source metal pattern which may include the source electrode SE and the drain electrode DE. For example, the fourth insulation layer 160 may include an organic insulation material such as a phenol resin, an acryl resin, a polyimide resin, a polyamide resin, a siloxane resin, an epoxy resin or the like.

An organic light-emitting diode 190 may be disposed on the fourth insulation layer 160. The organic light-emitting diode 190 may include a first electrode 192 electrically making contact with the drain electrode DE, an organic light-emitting layer 194 disposed on the first electrode 192 and a second electrode 196 disposed on the organic light-emitting layer 194. The organic light-emitting layer 194 of the organic light-emitting diode 190 may be disposed at least in an opening of a pixel-defining layer 180 disposed on the fourth insulation layer 160. The first electrode 192 may be a lower electrode of the organic light-emitting diode 190, and the second electrode 196 may be an upper electrode of the organic light-emitting diode 190.

The first electrode 192 may function as an anode. For example, the first electrode 192 may be formed as a transmitting electrode or a reflecting electrode according to an emission type of the display device 10. When the first electrode 192 is a transmitting electrode, the first electrode 192 may include indium tin oxide, indium zinc oxide, zinc tin oxide, indium oxide, zinc oxide, tin oxide or the like. When the first electrode 192 is a reflecting electrode, the first electrode 192 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

The pixel-defining layer 180 has the opening overlapping at least a portion of the first electrode 192. For example, the pixel-defining layer 180 may include an organic insulating material.

The organic light-emitting layer 194 may include at least a light-emitting layer, and may further include at least one of a hole injection layer (HIL), a hole transporting layer (HTL), an electron transporting layer (ETL) and an electron injection layer (EIL). For example, the organic light-emitting layer 194 may include a low molecular weight organic compound or a high molecular weight organic compound.

In an exemplary embodiment of the inventive concept, the organic light-emitting layer 194 may emit a red light, a green light or a blue light. In another exemplary embodiment, the organic light-emitting layer 194 may emit a white light. The organic light-emitting layer 194 emitting a white light may have a multi-layered structure comprising a red-emitting layer, a green-emitting layer and a blue-emitting layer, or a single-layered structure comprising a mixture of a red-emitting material, a green-emitting material and a blue-emitting material.

The second electrode 196 may be formed as a transmitting electrode or a reflecting electrode according to an emission type of the display device. For example, the second electrode 196 may include a metal, a metal alloy, a metal nitride, a metal fluoride, a conductive metal oxide or a combination thereof.

For example, the second electrode 196 may be formed as a common layer extending continuously over a plurality of pixels in the display area DA. Referring to FIG. 2, the organic light-emitting layer 194 may be formed as a pattern. However, exemplary embodiments are not limited thereto. In one exemplary embodiment of the inventive concept, the organic light-emitting layer 194 may be formed as a common layer extending continuously over a plurality of pixels in the display area DA.

A cover substrate 220 is disposed on the organic light-emitting diode 190. For example, the cover substrate 220 may include glass, quartz, sapphire, a polymeric material or the like. In an exemplary embodiment, the cover substrate 220 may include a transparent rigid material such as glass.

For example, a spacer may be disposed under the cover substrate 220 to support the cover substrate 220. The spacer may be disposed between the cover substrate 220 and the organic light-emitting diode 190 or between the pixel-defining layer 180 and the second electrode 196 of the organic light-emitting diode 190.

A space between the cover substrate 220 and the organic light-emitting diode 190 may have a vacuum state or may be filled with a gas or a filling member. The filling member may include an organic layer, an inorganic layer or a combination thereof. Furthermore, as illustrated in FIG. 2 and FIG. 3, a sealing member SM may be disposed between the cover substrate 220 and an array substrate 101 to combine the cover substrate 220 and the array substrate 101 with each other and to encapsulate a pixel array.

Referring to FIG. 3, an input pad 152 may be disposed in a bonding area BA. In an exemplary embodiment of the inventive concept, the input pad 152 may be electrically connected to a transfer wiring TL. The input pad 152 may be disposed on an insulation layer 142 and may pass through the insulation layer 142 to electrically make contact with the transfer wiring TL.

For example, the input pad 152 may be formed from a same layer as the first source metal pattern disposed in the display area DA. As illustrated in FIG. 2, the first source metal pattern may be disposed on the third insulation layer 150. The first source metal pattern may include a source electrode SE and a drain electrode DE, which electrically make contact with the active pattern AP. In one exemplary embodiment, the input pad 152 may be formed from a same layer as the first source metal pattern comprising a source electrode SE and a drain electrode DE in the display area DA. However, exemplary embodiments are not limited thereto. For example, the input pad 152 may be formed from a same layer as the first gate metal pattern, the second gate metal pattern, the first electrode 192 or a combination thereof. In one exemplary embodiment, the input pad 152 may be formed from a same layer as the first gate metal pattern comprising a gate electrode GE, the second gate metal pattern comprising a capacitor electrode pattern CE, the first electrode 192 or a combination thereof.

The input pad 152 may be bonded to a bridge board BS.

In an exemplary embodiment of the inventive concept, the bridge board BS may include a first body portion 312 and a second body portion 314. The second body portion 314 may extend from a portion of the first body portion 312 along a vertical direction. A horizontal width of the second body portion 314 may be smaller than a horizontal width of the first body portion 312. Thus, the bridge board BS may have a step shape or an L-shape. In one exemplary embodiment of the inventive concept, a vertical thickness of the first body portion 312 may be smaller than a horizontal width of the second body portion 314. In another exemplary embodiment, a vertical thickness of the first body portion 312 may be smaller than a vertical width of the second body portion 314.

A first connection pad 322 may be disposed on a surface of the first body portion 312. The first connection pad 322 may be disposed on a lower surface of the first body portion 312 to face the input pad 152. A first conductive bonding member CB1 may be disposed between the first connection pad 322 and the input pad 152. Thus, the input pad 152 may be electrically connected to the first connection pad 322, and the display panel 100 may be combined with the bridge board BS.

According to one exemplary embodiment, the first connection pad 322 may extend along a horizontal direction so that a portion of the first connection pad 322 may be disposed between the first body portion 312 and the second body portion 314.

A second connection pad 324 may be disposed on a surface of the second body portion 314. The second connection pad 324 may be disposed on a lower surface of the second body portion 314 to face an output pad 412 of a bonding substrate 410. A second conductive bonding member CB2 may be disposed between the second connection pad 324 and the output pad 412. Thus, the output pad 412 may be electrically connected to the second connection pad 324, and the bridge board BS may be combined with the bonding substrate 410.

The bridge board BS may include a via connection portion 326 passing through the second body portion 314 to electrically connect the first connection pad 322 and the second connection pad 324.

In an exemplary embodiment of the inventive concept, a driving chip 420 may be mounted on the bonding substrate 410. The driving chip 420 may be electrically connected to the output pad 412. The driving chip 420 may be bonded to an upper surface or a lower surface of the bonding substrate 410. In an exemplary embodiment, the bonding substrate 410 may comprise a flexible printed circuit board including a polymeric base film, which is flexible. For example, the flexible bonding substrate 410 may include a base film including polyimide, polyamide, polyethylene, polypropylene, polyethylene terephthalate or the like. In another exemplary embodiment, the bonding substrate 410 may comprise a rigid printed circuit board including, for example, a cured resin. In an exemplary embodiment, the bridge board BS may include a cured resin.

Thus, a driving signal generated by the driving chip 420 may be transmitted to the transfer wiring TL of the display panel 100 through the bridge board BS.

The first body portion 312 and the second body portion 314 may include an insulating material, respectively. For example, the first body portion 312 and the second body portion 314 may include a thermosetting resin, a thermoplastic resin, a ceramic, an organic-inorganic composite, a glass fiber impregnation resin or the like. In an exemplary embodiment, the first body portion 312 and the second body portion 314 may include a relatively rigid material, for example, a thermosetting resin (a cured resin) such as an epoxy resin or the like. In an exemplary embodiment of the inventive concept, the first body portion 312 and the second body portion 314 may be arbitrarily distinguished and explained for describing a shape and a function of the bridge board BS. In one exemplary embodiment, the first body portion 312 and the second body portion 314 may substantially form a single body block. In some cases, the first body portion 312 and the second body portion 314 may be joined together or separate.

The first connection pad 322, the second connection pad 324 and the via connection portion 326 may include a conductive material such as a metal, an alloy, a conductive oxide or the like, respectively. For example, at least one of the first connection pad 322, the second connection pad 324 and the via connection portion 326 may be formed through sputtering, evaporation deposition, plating or the like.

The first conductive bonding member CB1 and the second conductive bonding member CB2 may include a conventional conductive member such as a conductive bump, an anisotropic conductive film or the like, respectively. The first conductive bonding member CB1 and the second conductive bonding member CB2 may bond the display panel 100 to the bridge board BS and further bond the bridge board BS to the bonding substrate 410, respectively, through a bonding process such as pressing.

An area or space for bonding the bridge board BS to the bonding substrate 410 may be smaller than an area or space required for arranging a bending portion of a flexible printed circuit board. Thus, a bezel or a thickness of a display device may be reduced compared to a display device that uses a flexible printed circuit board and forms a bending portion of the flexible printed circuit board which connects a display panel to a printed circuit board.

Figure 4:
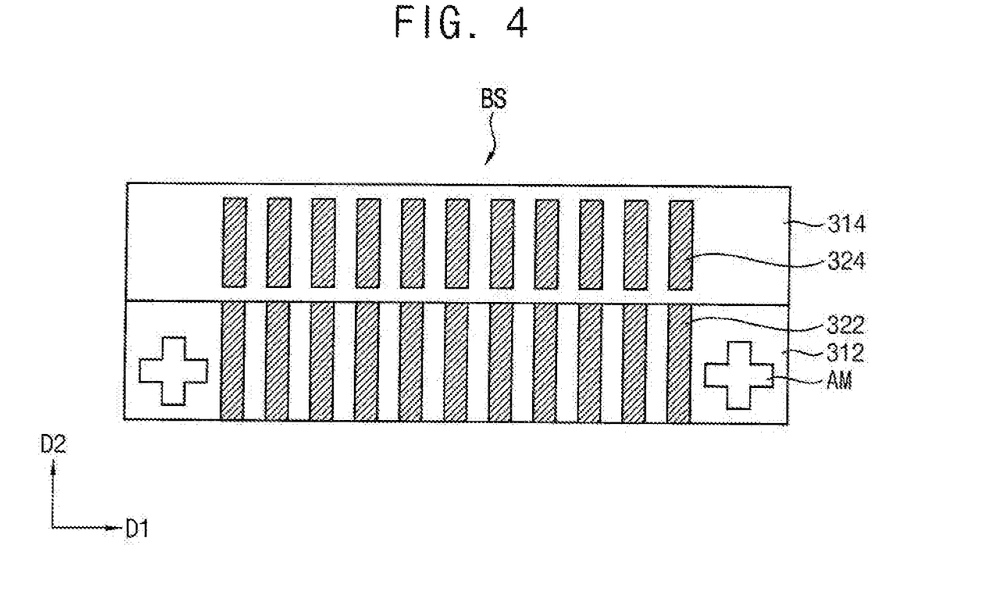
FIGS. 4 and 5 are enlarged views illustrating the bridge board BS of FIG. 1 according to exemplary embodiments of the inventive concept.
Figure 5:
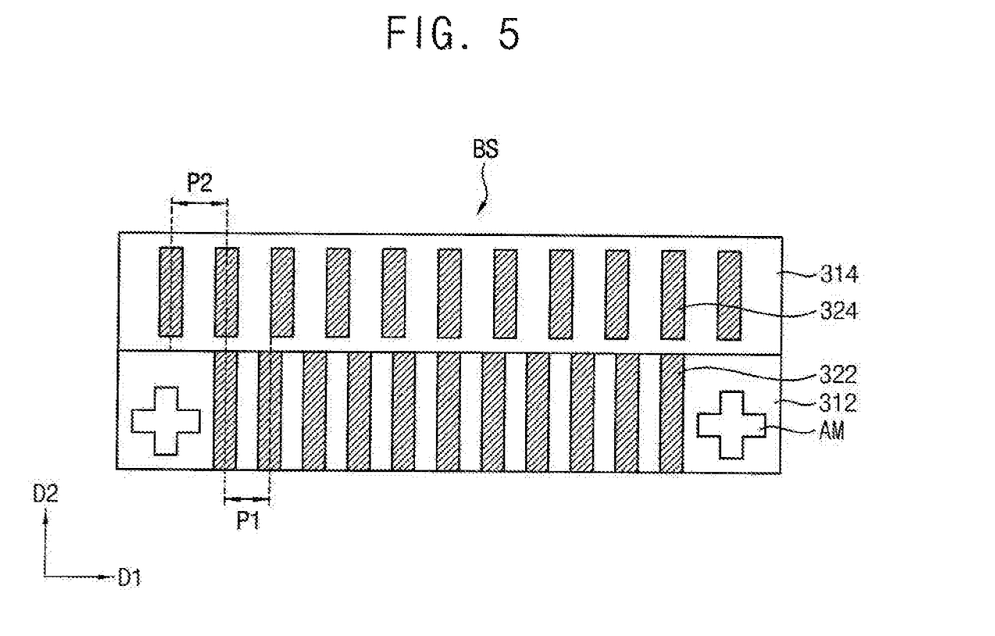

FIGS. 4 and 5 are enlarged views illustrating the bridge board BS of FIG. 1 according to exemplary embodiments of the inventive concept.

Referring to FIGS. 4 and 5, a plurality of first connection pads 322 may be arranged along a first direction D1 on a surface of a first body portion 312, and may have a shape extending along a second direction D2 perpendicular to the first direction D1. A plurality of second connection pads 324 may be arranged along the first direction D1 on a surface of the second body portion 314, and may have a shape extending along the second direction D2. In one exemplary embodiment of the inventive concept, the first connection pads 322 and the second connection pads 324 are of rectangular shape under a plan view.

At least two align marks AM may be arranged along a first direction D1 on a surface of the first body portion 312. The first connection pads 322 may be disposed between align marks AM for aligning the bridge board BS with the display panel 100 during a bonding process.

Referring to FIG. 5, a pitch P2 between each two pads of the second connection pads 324 may be larger than a pitch P1 between each two pads of the first connection pads 322. When the bonding substrate 410 is a flexible printed circuit board, and when a pitch between connection pads is relatively small, distribution defects may be caused by elongation of the flexible printed circuit board. In an exemplary embodiment of the inventive concept, a pitch P2 between the second connection pads 324 for bonding the bridge board BS to the bonding substrate 410, which is flexible, may be larger than a pitch P1 between the first connection pads 322 for bonding the bridge board BS, which is relatively rigid, to the display panel. Thus, distribution defects may be prevented and a pitch between each two pads of the input pads 152 of the display panel may be reduced.

According to exemplary embodiments of the inventive concept, a display panel 100 may be electrically connected to a bonding substrate 410 disposed under the display panel 100 through a bridge board BS without using a flexible printed circuit board and the bonding substrate is 410 directly bonded to the display panel 100.

Thus, the increase of a bezel or a thickness due to a space required for a bending of a flexible printed circuit board may be prevented, and a bending failure due to a bending stress may also be prevented.

Furthermore, distribution defects caused by elongation of a flexible printed circuit board when the flexible printed circuit board is bonded directly to the display panel may be prevented.

FIGS. 6 to 11 are cross-sectional views taken along line I-I' of FIG. 1 illustrating a bonding area of a display device according to exemplary embodiments of the inventive concept.

Figure 6:
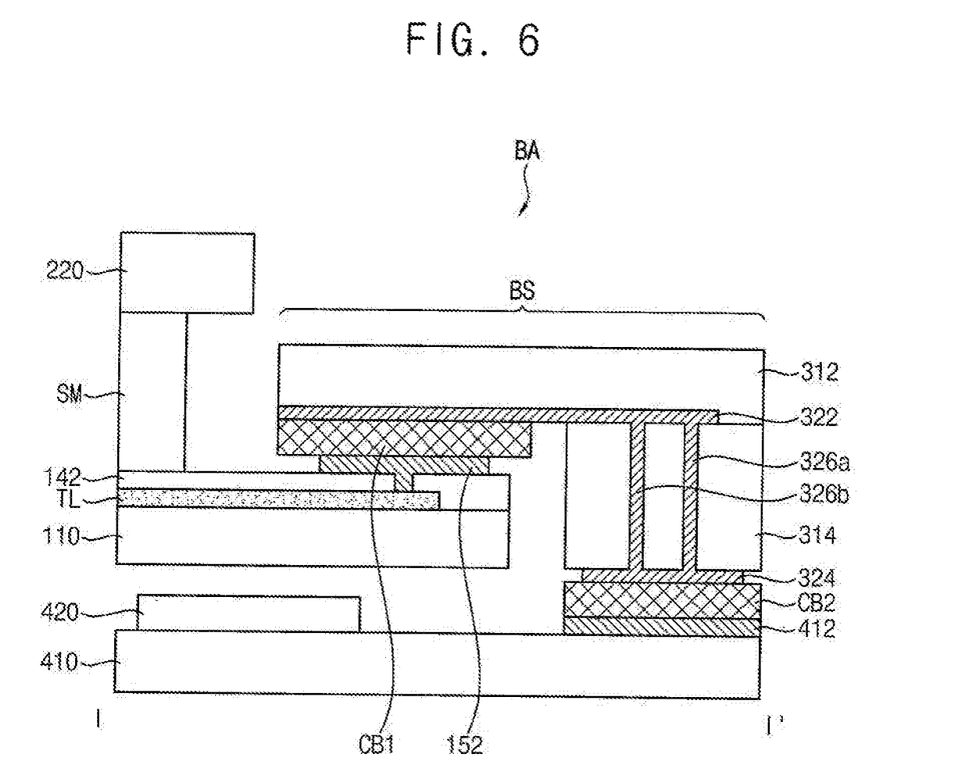
FIGS. 6 to 11 are cross-sectional views taken along line I-I' of FIG. 1 illustrating a bonding area of a display device according to exemplary embodiments of the inventive concept.

Referring to FIG. 6, a bridge board BS may be combined with a display panel and a bonding substrate 410, and electrically connects the display panel to the bonding substrate 410.

The bonding substrate 410 may include a first connection pad 322, a second connection pad 324 and a plurality of via connection portions. The first connection pad 322 may be bonded to the display panel. The second connection pad 324 may be bonded to the bonding substrate 410. The via connection portions may pass through a second body portion 314 to electrically connect the first connection pad 322 to the second connection pad 324.

For example, as illustrated in FIG. 6, the bridge board BS may include a first via connection portion 326a and a second via connection portion 326b. Exemplary embodiments of the inventive concept are not limited thereto. For example, the bridge board BS may include at least three via connection portions.

Figure 7:
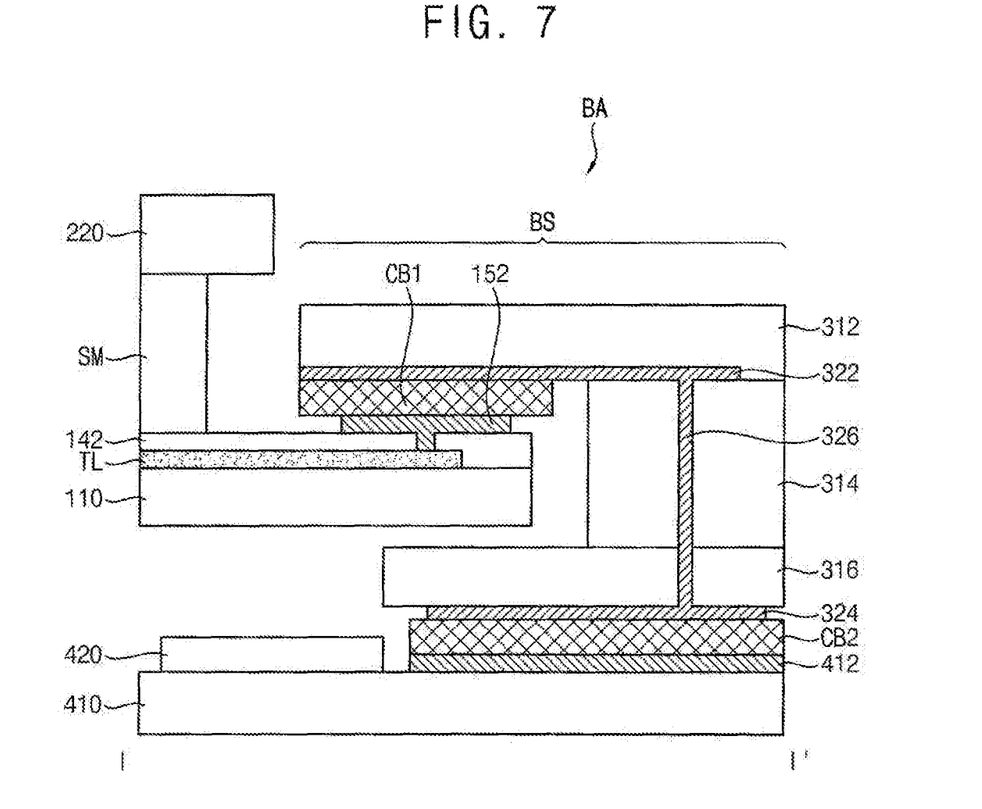

Referring to FIG. 7, a bridge board BS may include a first body portion 312 extending along a horizontal direction, a second body portion 314 protruding from the first body portion 312 and extending along a vertical direction and a third body portion 316 protruding from the second body portion 314 and extending along a horizontal direction.

For example, a lower surface of the first body portion 312 may face an input pad 152 disposed on an array substrate. A side surface of the second body portion 314 may face a side surface of a base substrate 110 of an array substrate. An upper surface of the third body portion 316 may face a lower surface of the base substrate 110. Thus, the array substrate may be combined with the bridge board BS so that a portion of the array substrate is inserted into the bridge board BS.

The bridge board BS may include a first connection pad 322, a second connection pad 324 and a via connection portion 326. The first connection pad 322 may be disposed on a lower surface of the first body portion 312 and bonded to a display panel. The second connection pad 324 may be disposed on a lower surface of the third body portion 316 and bonded to a bonding substrate 410. In an exemplary embodiment of the inventive concept, the first connection pad 322 may be bonded to the input pad 152. The second connection pad 324 may be bonded to the output pad 412. The via connection portion 326 may electrically connect the first connection pad 322 to the second connection pad 324, and may pass through the second body portion 314 and the third body portion 316.

According to one exemplary embodiment of the inventive concept, a length of the first connection pad 322 may be larger than a length of the second connection pad 324.

As illustrated in FIG. 7, the bridge board BS may include the third body portion 316, of which at least a portion is disposed under the base substrate 110 of the array substrate. The second connection pad 324 may be disposed on the lower surface of the third body portion 316. Thus, a display device may be designed so that a length of a contact area between the second connection pad 324 and an output pad 412 of the bonding substrate 410 may be larger than a length of a contact area between the first connection pad 322 and an input pad 152. Thus, a length of an area where the second connection pad 324 overlaps the output pad 412 may be larger than a length of an area where the first connection pad 322 overlaps the input pad 152.

The embodiments, illustrations, and examples shown above may be configured to improve a contact area of pads (e.g., length of a contact area) when the bonding substrate 410, which may be flexible, and the bridge board BS are bonded to each other. Thus, distribution defects may be prevented or alleviated.

Figure 8:
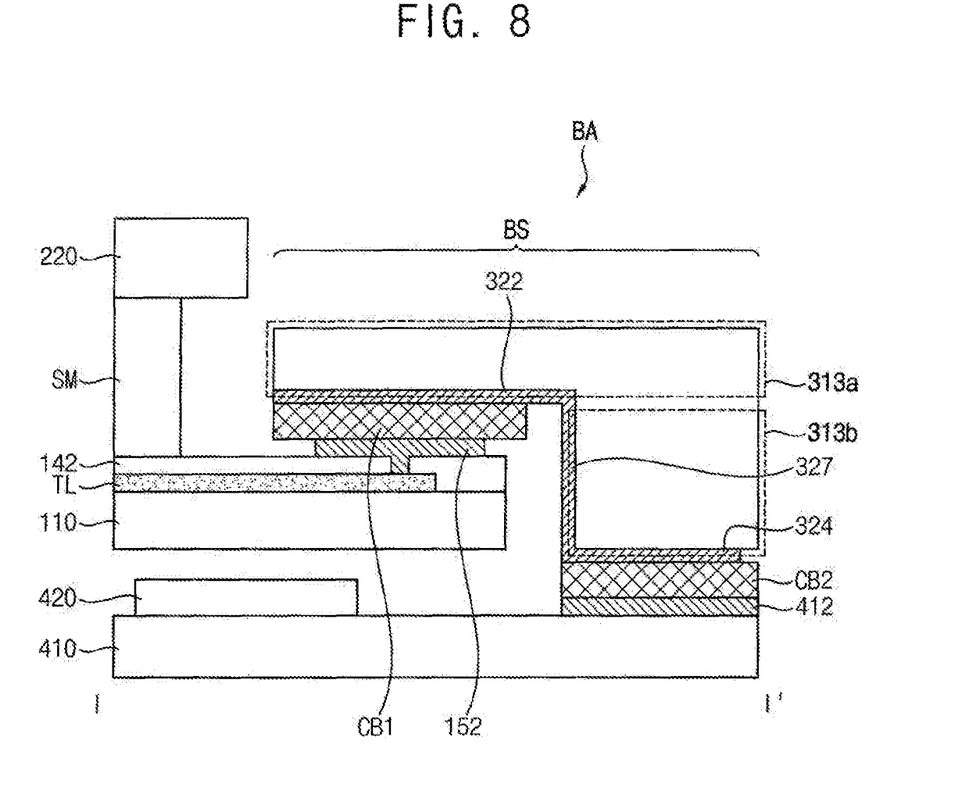

Referring to FIG. 8, a body portion of a bridge board BS may have a step shape or an L-shape. For example, the body portion may include a first body portion 313a extending along a horizontal direction and a second body portion 313b protruding from the first body portion 313a and extending along a vertical direction. For example, a lower surface of the first body portion 313a may face an input pad 152 disposed on an array substrate. A side surface of the second body portion 313b may face a side surface of a base substrate 110 of the array substrate.

The bridge board BS may include a first connection pad 322, a second connection pad 324 and a side connection portion 327. The first connection pad 322 may be disposed on a lower surface of the first body portion 313a and bonded to a display panel. The second connection pad 324 may be disposed on a lower surface of the second body portion 313b and bonded to a bonding substrate 410. The side connection portion 327 may be disposed on a side surface of the second body portion 313b and may electrically connect the first connection pad 322 to the second connection pad 324. In an exemplary embodiment of the inventive concept, the side connection portion 327 may extend along the side surface of the second body portion 313b. For example, the first connection pad 322, the second connection pad 324 and the side connection portion 327 may be formed in a same process using plating or the like, and may form a continuous pattern.

Figure 9:
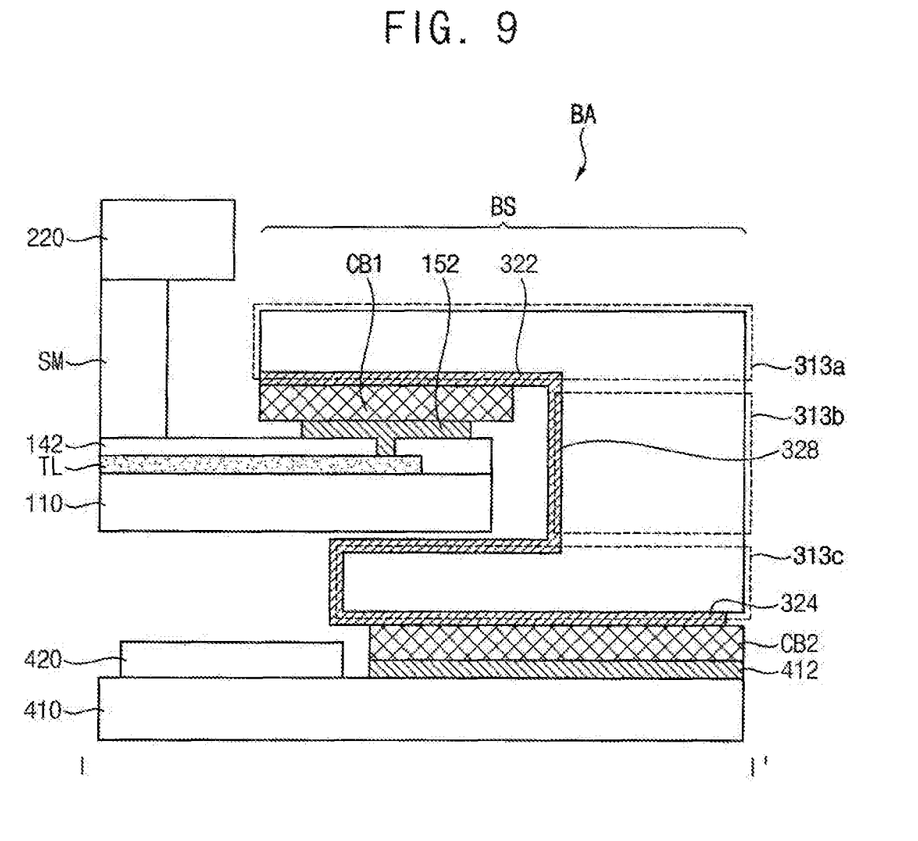

Referring to FIG. 9, a bridge board BS may include a first body portion 313a extending along a horizontal direction, a second body portion 313b protruding from the first body portion 313a and extending along a vertical direction, and a third body portion 313c protruding from the second body portion 313b and extending along a horizontal direction. For example, a lower surface of the first body portion 313a may face an input pad 152 disposed on an array substrate. A side surface of the second body portion 313b may face a side surface of a base substrate 110 of the array substrate. An upper surface of the third body portion 313c may face a lower surface of the base substrate 110. Thus, the array substrate may be combined with the bridge board BS so that a portion of the array substrate is inserted into the bridge board BS.

The bridge board BS may include a first connection pad 322, a second connection pad 324 and a side connection portion 328. The first connection pad 322 may be disposed on a lower surface of the first body portion 313a and bonded to a display panel. The second connection pad 324 may be disposed on a lower surface of the third body portion 313c and bonded to a bonding substrate 410. The side connection portion 328 may electrically connect the first connection pad 322 to the second connection pad 324. The side connection portion 328 may extend along a side surface of the second body portion 313b, the upper surface of the third body portion 313c and a side surface of the third body portion 313c.

The first connection pad 322, the second connection pad 324 and the side connection portion 328 may be formed in a same process using plating or the like, and may form a continuous pattern.

Figure 10:
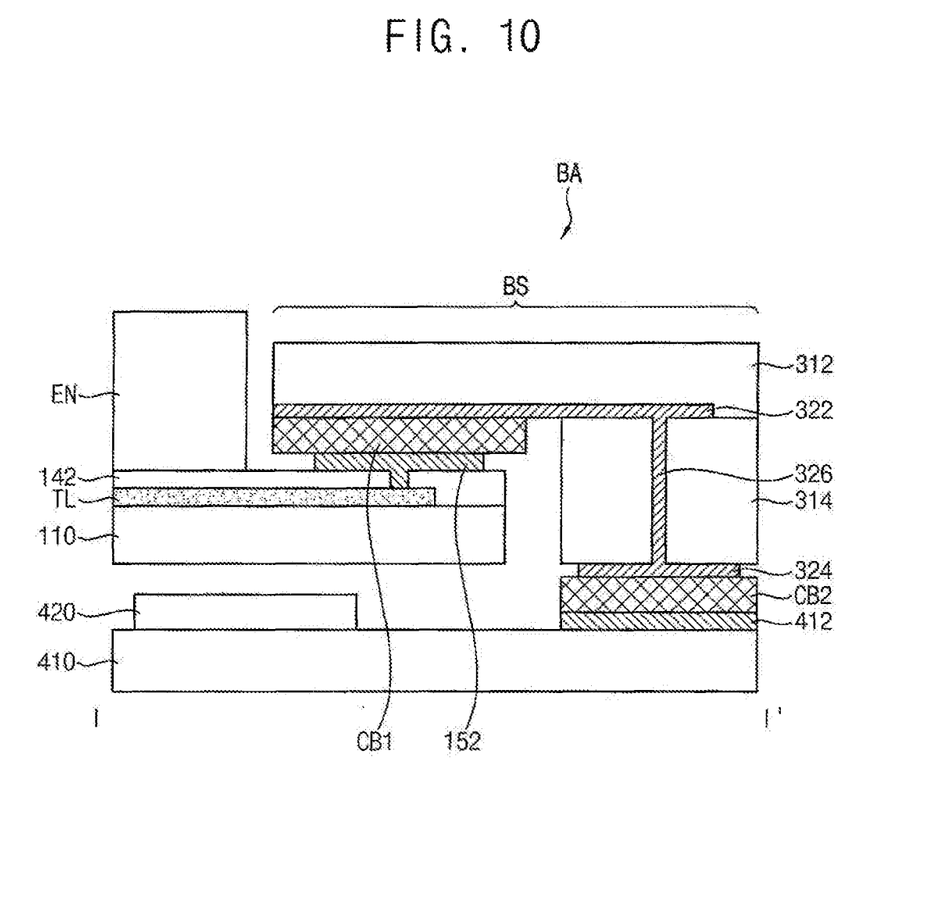

Referring to FIG. 10, a display panel may not include a cover substrate 220 and a sealing member SM. For example, a pixel array of the display panel may be encapsulated by an encapsulation layer EN. The encapsulation layer EN may have a stacked structure of an organic thin film and an inorganic thin film.

Figure 11:
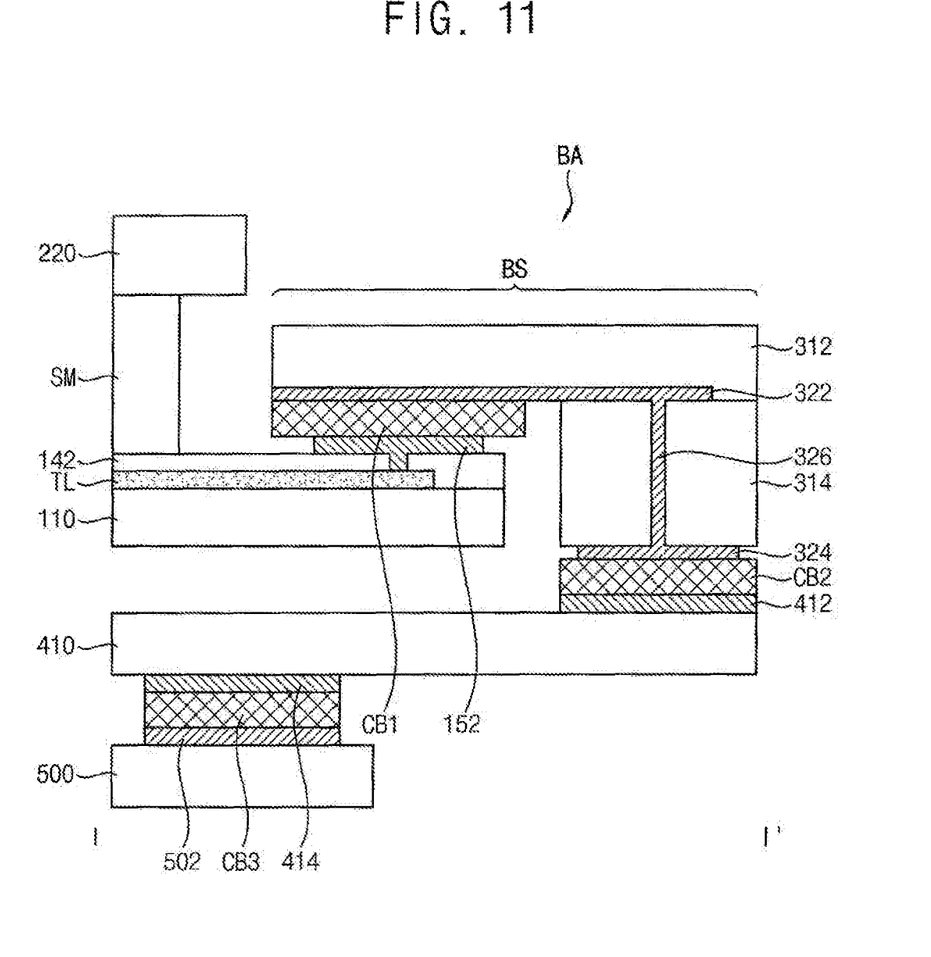

Referring to FIG. 11, a bonding substrate 410 may be connected to another substrate. In an exemplary embodiment of the inventive concept, the bonding substrate 410 may be bonded to a control substrate 500 including a controller mounted thereon.

For example, the bonding substrate 410 may include an output pad 412 bonded to a bridge board BS and an input pad 414 bonded to the control substrate 500. The input pad 414 of the bonding substrate 410 may be electrically connected to an output pad 502 of the control substrate 500 through a conductive connection member CB3.

As illustrated in FIG. 11, the bonding substrate 410 may include a transferring substrate, which does not include a driver.

The exemplary embodiments, illustrations, accompanying drawings and examples shown above provide a bonding structure and an organic-light emitting display device including the same. However, exemplary embodiments are not limited thereto. For example, exemplary embodiments of the inventive concept may be applied to a bonding structure of display devices such as a liquid crystal display device, a electroluminescent display device, a micro LED display device or the like.

Furthermore, exemplary embodiments of inventive concept may include a display device comprising an encapsulation layer or a flexible window instead of a rigid cover substrate.

Furthermore, exemplary embodiments may include a display device comprising a flexible base substrate.

Exemplary embodiments of the inventive concept may be applied to various display devices. For example, one exemplary embodiment may be applied to a vehicle-display device, a ship-display device, an aircraft-display device, a portable communication device, a display device for display or communication purpose, a medical-display device, etc.

While the inventive concept has been particularly shown and described with reference to the exemplary embodiments and accompanying drawings thereof, it will be understood by one of ordinary skill in the art that variations in form and detail may be made therein without departing from the spirit and scope of the inventive concept as defined by the following claims.

What is claimed is:

1. A display device, comprising: a display panel including a pixel array disposed on a base substrate and an input pad electrically connected to the pixel array; a bonding substrate disposed under the display panel and including an output pad; and a bridge board including a first body portion, a second body portion, and a via connection portion extending in a vertical direction perpendicular to the base substrate and electrically connecting the input pad of the display panel and the output pad of the bonding substrate, wherein the first body portion extends along a horizontal direction parallel to the base substrate and is bonded to the input pad of the base substrate, the second body portion extends from a lower surface of the first body portion in the vertical direction and is bonded to the bonding substrate, the via connection portion passes through the second body portion, the second body portion has a side surface facing a side surface of the base substrate, and wherein the second body portion of the bridge board includes a rigid material.

2. The display device of claim 1, wherein the bridge board includes a cured resin.

3. The display device of claim 1, wherein the bridge board has a step shape or an L-shape.

4. The display device of claim 1, wherein the bridge board further includes a first connection pad and a second connection pad, the first connection pad being disposed on a lower surface of the first body portion, extending in the horizontal direction, and bonded to the input pad, the second connection pad being disposed on a lower surface of the second body portion, extending in the horizontal direction, and bonded to the output pad, and wherein the via connection portion directly connects the first connection pad to the second direction pad.

5. The display device of claim 4, wherein a pitch between two adjacent second connection pads is larger than a pitch between two adjacent first connection pads.

6. The display device of claim 4, wherein the bridge board further includes a via connection portion that electrically connects the first connection pad to the second connection pad and passes through the second body portion.

7. The display device of claim 4, wherein the bridge board further includes a side connection portion that electrically connects the first connection pad to the second connection pad and extends along the side surface of the second body portion.

8. The display device of claim 1, wherein the bridge board further includes a third body portion protruding from the second body portion and extending along a horizontal direction, and having an upper surface facing a lower surface of the base substrate.

9. The display device of claim 8, wherein the bridge board further includes a first connection pad and a second connection pad, the first connection pad being disposed on a lower surface of the first body portion and bonded to the input pad, the second connection pad being disposed on a lower surface of the third body portion and bonded to the output pad.

10. The display device of claim 9, wherein a length of an area where the second connection pad overlaps the output pad is larger than a length of an area where the first connection pad overlaps the input pad.

11. The display device of claim 9, wherein the bridge board further comprises a via connection portion that electrically connects the first connection pad to the second connection pad and passes through the second body portion and the third body portion.

12. The display device of claim 9, wherein the bridge board further comprises a side connection portion that electrically connects the first connection pad to the second connection pad and extends along the side surface of the second body portion, the upper surface of the third body portion and a side surface of the third body portion.

13. The display device of claim 1, wherein the bonding substrate includes a flexible printed circuit board including a polymeric base film.

14. The display device of claim 13, wherein the bonding substrate includes a driving chip mounted thereon.

15. The display device of claim 1, further including a control substrate electrically connected to the bonding substrate.

16. A display device, comprising: a display panel including a pixel array disposed on a base substrate and an input pad electrically connected to the pixel array; a bonding substrate disposed under the display panel and including an output pad; and a bridge board including a first body portion, a second body portion, and a via connection portion extending in a vertical direction perpendicular to the base substrate and electrically connecting the input pad of the display panel and the output pad of the bonding substrate, wherein the first body portion faces the input pad and extends along a horizontal direction parallel to the base substrate and is bonded to the input pad of the base substrate, and wherein the second body portion extends from a lower surface the first body portion along a vertical direction perpendicular to the base substrate, is bonded to the bonding substrate, and has a side surface facing a side surface of the base substrate, wherein the second body portion of the bridge board is formed of a rigid material, and wherein a vertical thickness of the first body portion is smaller than a horizontal width of the second body portion.

17. The display device of claim 16, wherein the bonding substrate includes a flexible printed circuit board including a polymeric base film.

18. The display device of claim 16, wherein the bonding substrate includes a driving chip mounted thereon.

* * * * *